United States Patent
Kim et al.

(10) Patent No.: US 11,125,787 B2
(45) Date of Patent: Sep. 21, 2021

(54) SEMICONDUCTOR DEVICE AND SEMICONDUCTOR SYSTEM COMPRISING THE SAME

(71) Applicant: SAMSUNG ELECTRONICS CO., LTD., Suwon-si (KR)

(72) Inventors: Do Hyung Kim, Seoul (KR); Min Young Kang, Gunpo-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 209 days.

(21) Appl. No.: 16/420,751

(22) Filed: May 23, 2019

(65) Prior Publication Data
US 2020/0182916 A1 Jun. 11, 2020

(30) Foreign Application Priority Data
Dec. 11, 2018 (KR) .................. 10-2018-0159166

(51) Int. Cl.
*G01R 19/165* (2006.01)

(52) U.S. Cl.
CPC . *G01R 19/16595* (2013.01); *G01R 19/16576* (2013.01)

(58) Field of Classification Search
CPC ........ G01R 19/16576; G01R 19/16519; G01R 19/00; G01R 19/16595; G05F 3/26
(Continued)

(56) References Cited

U.S. PATENT DOCUMENTS

| | | | | |
|---|---|---|---|---|
| 5,754,039 A | * | 5/1998 | Nishimura | G05F 1/561 323/315 |
| 6,989,692 B1 | * | 1/2006 | Wong | H03K 5/08 327/77 |

(Continued)

FOREIGN PATENT DOCUMENTS

| | | |
|---|---|---|
| JP | 2002-229856 A | 8/2002 |
| JP | 2006-127648 A | 5/2006 |

(Continued)

OTHER PUBLICATIONS

Singh, T., et al., Abstract of "Zen; An Energy-Efficient High-Performance x 86 Core", Nov. 2017, IEEE Journal of Solid-State Circuits, 1 page total.

(Continued)

*Primary Examiner* — Christopher P McAndrew
(74) *Attorney, Agent, or Firm* — Sughrue Mion, PLLC

(57) ABSTRACT

A semiconductor device is provided and includes: a voltage sensing circuit configured to output first and second sensing voltages based on a target voltage applied thereto; and a comparing circuit configured to generate a monitoring output signal based on levels of the first and second sensing voltages, wherein the voltage sensing circuit includes: a first transistor including a gate to receive a reference bias voltage, a source connected to an input node, and a drain connected to one end of a first resistive element; a second transistor provided in a current mirror structure with the first transistor, and including a drain connected to a third resistive element; and a second resistive element connected to another end of the first resistive element, the first sensing voltage being provided to both ends of the second resistive element, and the second sensing voltage being provided to both ends of the third resistive element.

23 Claims, 14 Drawing Sheets

(58) Field of Classification Search
USPC .......................................................... 324/713
See application file for complete search history.

(56) References Cited

U.S. PATENT DOCUMENTS

| | | | |
|---|---|---|---|
| 7,378,833 B2 | 5/2008 | Wagner | |
| 7,433,253 B2* | 10/2008 | Gogl | G11C 5/02 |
| | | | 327/53 |
| 7,526,390 B2 | 4/2009 | Kajita | |
| 8,242,770 B2* | 8/2012 | Tanaka | G01R 31/396 |
| | | | 324/123 R |
| 8,957,665 B2* | 2/2015 | Hayakawa | G01R 19/16542 |
| | | | 324/76.11 |
| 9,566,920 B2 | 2/2017 | Melzl et al. | |
| 10,175,118 B1* | 1/2019 | Rezayee | G01K 7/16 |
| 2006/0033547 A1* | 2/2006 | Chou | G01R 19/16552 |
| | | | 327/310 |
| 2006/0082395 A1* | 4/2006 | Fukushi | G01R 19/16552 |
| | | | 327/77 |
| 2006/0164125 A1* | 7/2006 | Mulder | G01R 19/16557 |
| | | | 327/52 |
| 2006/0164126 A1* | 7/2006 | Mulder | G01R 19/16557 |
| | | | 327/52 |
| 2010/0185888 A1 | 7/2010 | Hahn et al. | |
| 2016/0055049 A1 | 2/2016 | Lukashevich | |
| 2016/0062385 A1* | 3/2016 | Koerner | G05F 3/26 |
| | | | 323/313 |

FOREIGN PATENT DOCUMENTS

| | | |
|---|---|---|
| JP | 2009-3663 A | 1/2009 |
| JP | 2014-130518 A | 7/2014 |
| KR | 10-1646210 B1 | 8/2016 |
| KR | 10-1826777 B1 | 3/2018 |

OTHER PUBLICATIONS

Muhtaroglu, A., et al., Abstract of "On-Die Droop Detector for Analog Sensing of Power Supply Noise", Jul. 2003, Conference Paper in IEEE Journal of Solid-State Circuits, 1 page total.

* cited by examiner

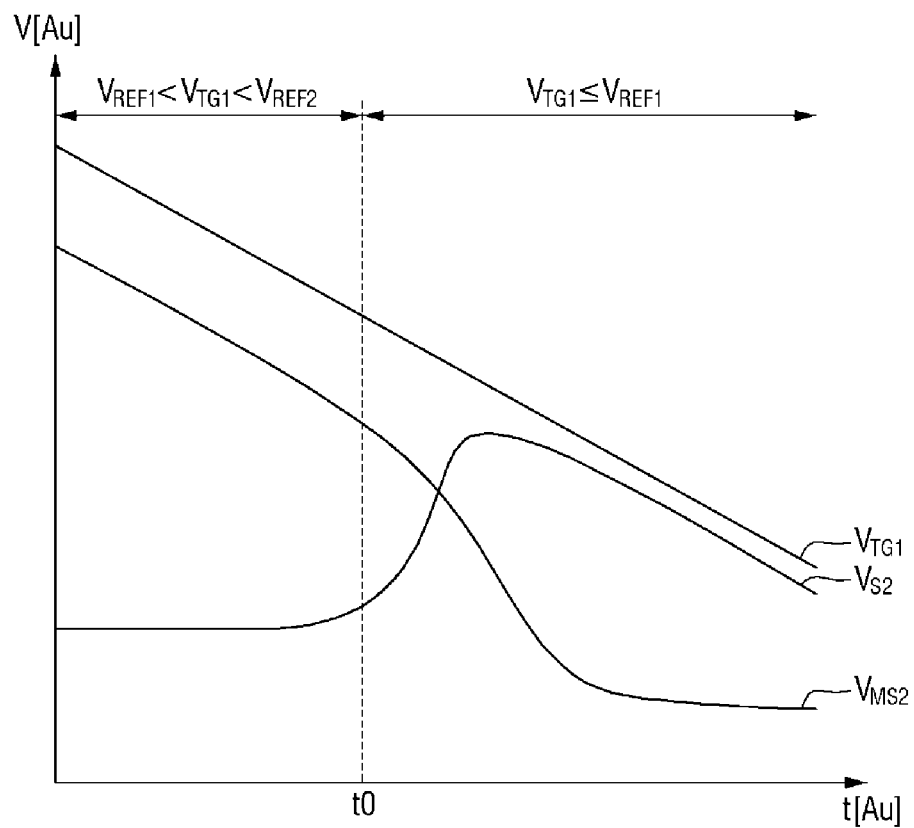

200

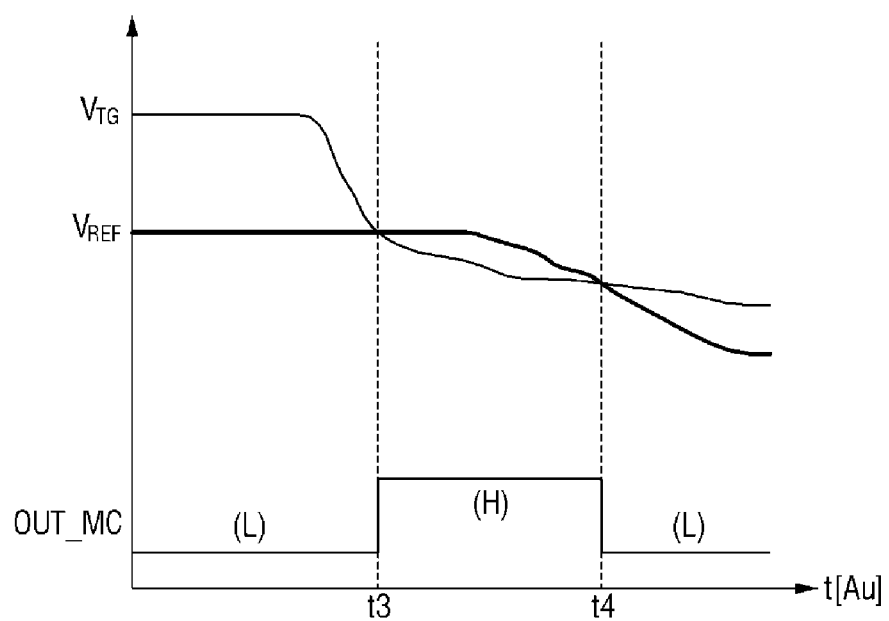

SEMICONDUCTOR DEVICE AND SEMICONDUCTOR SYSTEM COMPRISING THE SAME

CROSS-REFERENCE TO RELATED APPLICATION

This application claims priority under 35 U.S.C. 119 from Korean Patent Application No. 10-2018-0159166, filed on Dec. 11, 2018 in the Korean Intellectual Property Office, the contents of which in its entirety are herein incorporated by reference.

BACKGROUND

1. Field

Apparatuses and methods consistent with one or more exemplary embodiments relate to a semiconductor device and a semiconductor system including the same.

2. Description of the Related Art

Related art electronic device include a plurality of circuits. When signals to be supplied to the plurality of circuits are operated, security information and the like included in the plurality of circuits may leak. For example, in a case where a voltage supplied to a particular circuit is significantly lowered due to an external malicious attack or the like, security of the particular circuit may be weakened.

In order to ensure reliability of security for the plurality of circuits, signals to be supplied to each of the plurality of circuits may be monitored.

On the other hand, in a case where a device that monitors signals supplied to each of the plurality of circuits is under malicious attack from the outside, since the monitoring of the signals supplied to each of the plurality of circuits is itself not normally operated, it is not possible to reliably secure the plurality of circuits.

SUMMARY

Aspects of one or more exemplary embodiments provide a semiconductor device and a semiconductor system including the same, in which a monitoring circuit is disposed in a monitoring circuit to ensure reliability of operation and security of a circuit to be monitored.

Aspects of one or more exemplary embodiments also provide a semiconductor device and a semiconductor system including the same, capable of determining a case where the reliability of the operation and security of the monitoring circuit itself is degraded, using a monitoring circuit.

However, aspects of exemplary embodiments are not restricted to those set forth herein. The above and other aspects will become more apparent to one of ordinary skill in the art by referencing the detailed description provided below.

According to an aspect of an exemplary embodiment, there is provided a semiconductor device including: a voltage sensing circuit to which a target voltage is applied from an input node, and configured to output a first sensing voltage and a second sensing voltage based on the target voltage; and a comparing circuit configured to generate a monitoring output signal corresponding to the target voltage based on a level of the first sensing voltage and a level of the second sensing voltage, wherein the voltage sensing circuit includes: a first transistor including a gate to receive a reference bias voltage, a source connected to the input node, and a drain connected to one end of a first resistive element; a second transistor provided in a current mirror structure with the first transistor, and including a gate to receive the reference bias voltage, a source connected to the input node, and a drain connected to a third resistive element; and a second resistive element connected to an other end of the first resistive element, and wherein the first sensing voltage is a voltage provided to both ends of the second resistive element, and the second sensing voltage is a voltage provided to both ends of the third resistive element.

According to an aspect of another exemplary embodiment, there is provided a semiconductor device including: a first voltage monitoring circuit to which a first target voltage is applied, and configured to generate a first monitoring output signal indicative of whether a level of the first target voltage is included in a first reference voltage range, using a first transistor and a second transistor arranged in a current mirror structure; and a second voltage monitoring circuit to which the first target voltage and a second target voltage are applied, and configured to generate a second monitoring output signal indicative of whether a level of the second target voltage is included in a second reference voltage range based on the level of the first target voltage and the level of the second target voltage, wherein a same reference bias voltage is applied to a gate of the first transistor and a gate of the second transistor, and a magnitude of the first transistor is different from a magnitude of the second transistor.

According to an aspect of another exemplary embodiment, there is provided a semiconductor system including: a first voltage monitoring circuit to which a first target voltage is applied, and configured to generate a first monitoring output signal indicative of whether a level of the first target voltage is included in a first reference voltage range, using a first transistor and a second transistor arranged in a current mirror structure; a second voltage monitoring circuit to which the first target voltage and a second target voltage applied to a target circuit are applied, and configured to generate a second monitoring output signal indicative of whether a level of the second target voltage is included in a second reference voltage range based on the level of the first target voltage and the level of the second target voltage, and a controller configured to receive the first monitoring output signal and the second monitoring output signal, and to determine whether the level of the second target voltage is included in a third reference voltage range, based on a level of the first monitoring output signal and a level of the second monitoring output signal.

BRIEF DESCRIPTION OF THE DRAWINGS

The above and other aspects and features will become more apparent by describing in detail exemplary embodiments with reference to the attached drawings, in which:

FIG. 3B is a graph illustrating a change of a second sensing voltage according to a level of a first target voltage;

FIG. 8C is a graph illustrating a monitoring output signal that is output in a case where both a target voltage and a reference voltage are attacked;

DETAILED DESCRIPTION

Figure 1:
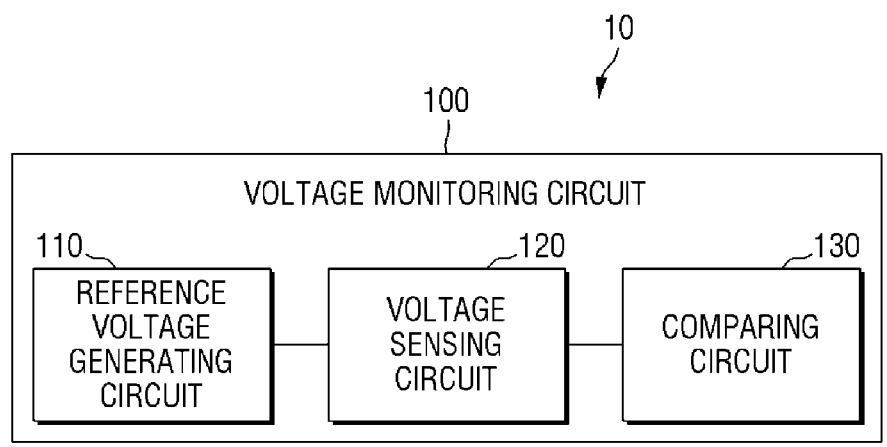
FIG. 1 is a block diagram schematically illustrating a configuration of a first monitoring circuit according to an exemplary embodiment.

FIG. 1 is a block diagram schematically illustrating a configuration of a first monitoring circuit 100 according to an exemplary embodiment.

Referring to FIG. 1, a semiconductor device 10 according to an exemplary embodiment may include a first monitoring circuit 100 (e.g., voltage monitoring circuit). The first monitoring circuit 100 may include a reference voltage generating circuit 110, a voltage sensing circuit 120, and a first comparing circuit 130.

The reference voltage generating circuit 110 may generate a reference bias voltage $V_A$ to be applied to the voltage sensing circuit 120. The voltage sensing circuit 120 receives the reference bias voltage $V_A$ and a first target voltage $V_{TG1}$, and may generate a first sensing voltage $V_{S1}$ and a second sensing voltage $V_{S2}$ on the basis of the reference bias voltage $V_A$ and the first target voltage $V_{TG1}$. The voltage sensing circuit 120 may provide the generated first sense voltage $V_{S1}$ and the generated second sensing voltage $V_{S2}$ to the first comparing circuit 130. The first comparing circuit 130 compares the levels of the first sensing voltage $V_{S1}$ and the second sensing voltage $V_{S2}$ provided from the voltage sensing circuit 120 to output a first monitoring output signal OUT_MC1. A detailed description of the operations of the first monitoring circuit 100 will be described below with reference to FIGS. 2, 3A to 3B, 4, and 5.

Figure 2:
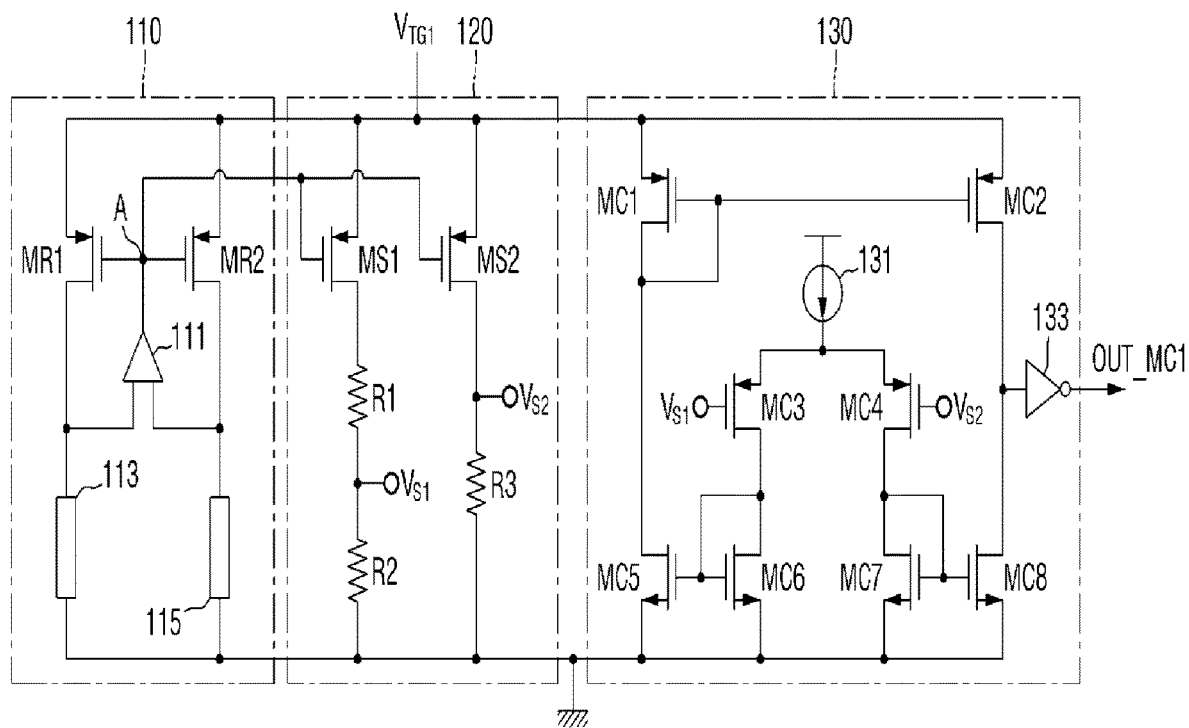
FIG. 2 is a circuit diagram illustrating a configuration of a first monitoring circuit according to an exemplary embodiment.

FIG. 2 is a circuit diagram illustrating a configuration of a first monitoring circuit 100 according to an exemplary embodiment.

Referring to FIG. 2, the first monitoring circuit 100 may include a reference voltage generating circuit 110, a voltage sensing circuit 120, and a first comparing circuit 130.

The reference voltage generating circuit 110 may include a first reference transistor MR1, a second reference transistor MR2, an operational amplifier 111, a first element 113 and a second element 115. The operational amplifier 111 may be replaced by another kind of active element such as a transistor. At least one of passive elements such as resistive elements, capacitors and inductors may be selectively adapted as the first element 113 and/or the second element 115. Also, it is understood that the illustrated reference voltage generating circuit 110 is provided for the convenience of explanation, and an arbitrary structure, in which a reference bias voltage $V_A$ is generated and a node to which the reference bias voltage $V_A$ is applied may be shared with the voltage sensing circuit 120, may be applied to the structure of the reference voltage generating circuit 110.

The reference voltage generating circuit 110 generates the reference bias voltage $V_A$. Specifically, the voltage provided to a node A connected to an output terminal of the operational amplifier 111 may be the reference bias voltage $V_A$. The node A to which the reference bias voltage $V_A$ is applied may be shared with the voltage sensing circuit 120.

The voltage sensing circuit 120 may include a first transistor MS1, a second transistor MS2, a first resistive element R1, a second resistive element R2, and a third resistive element R3. As illustrated, the first transistor MS1 and the second transistor MS2 may be connected in a current mirror structure. The reference bias voltage $V_A$ may be applied to gates of each of the first transistor MS1 and the second transistor MS2. The reference bias voltage $V_A$ may be a voltage generated by the reference voltage generating circuit 110. Specifically, the node A of the reference voltage generating circuit 110 is electrically connected to the gate of the first transistor MS1 and the gate of the second transistor MS2. That is, the node A may be shared with the gate of the first transistor MS1 and the gate of the second transistor MS2.

The first target voltage $V_{TG1}$ may be applied to the source of the first transistor MS1. One end of the first resistive element R1 may be connected to the drain of the first transistor MS1, and the other end of the first resistive element R1 may be connected to one end of the second resistive element R2. The other end of the second resistive element R2 may be connected to a ground as illustrated. According to one or more other exemplary embodiments, the first resistive element R1 and/or the second resistive element R2 may be replaced by other types of passive elements such as capacitors and inductors.

The first target voltage $V_{TG1}$ may be applied to the source of the second transistor MS2. One end of the third resistive element R3 is connected to the drain of the second transistor MS2, and the other end of the third resistive element R3 may be connected to the ground. According to one or more other exemplary embodiments, the third resistive element R3 may be replaced by another type of passive element.

The voltage sensing circuit 120 may generate a first sensing voltage $V_{S1}$ and a second sensing voltage $V_{S2}$. At this time, the first sensing voltage $V_{S1}$ may be a voltage provided to both ends of the second resistive element R2, and the second sensing voltage $V_{S2}$ may be a voltage provided to both ends of the third resistive element R3. In the present description, the first resistive element R1, the second resistive element R2, and the third resistive element R3 are provided as resistive elements having the same resistance value. It is understood, however, that one or more other embodiments are not limited thereto, and two or more of the first to third resistive elements R1, R2 and R3 may have resistance values different from each other.

The first comparing circuit 130 may include first to eighth comparison transistors MC1, MC2, MC3, MC4, MC5, MC6, MC7 and MC8, a current source 131, and an inverter 133. The first comparing circuit 130 receives the first sensing voltage $V_{S1}$ and the second sensing voltage $V_{S2}$ as inputs from the voltage sensing circuit 120, and may output the first monitoring output signal OUT_MC1 on the basis of the levels of the first sensing voltage $V_{S1}$ and the second sensing voltage $V_{S2}$. It is understood, however, that the first comparing circuit 130 is not limited to the illustrated configuration, and any type of comparing circuit that receives the input of the plurality of signals and generate an output signal on the basis of the magnitude of the input signal may be applied.

A specific process, in which the reference bias voltage $V_A$ is applied to the respective gates of the first transistor MS1 and the second transistor MS2, the first sensing voltage $V_{S1}$ and the second sensing voltage $V_{S2}$ are generated on the basis of the reference bias voltage $V_A$ and the first target voltage $V_{TG1}$, and the first monitoring output signal OUT_MC1 is output from the first comparing circuit 130 on the basis thereof, will be described below with reference to FIGS. 3A. 3B, 4, and 5.

Figure 3A:
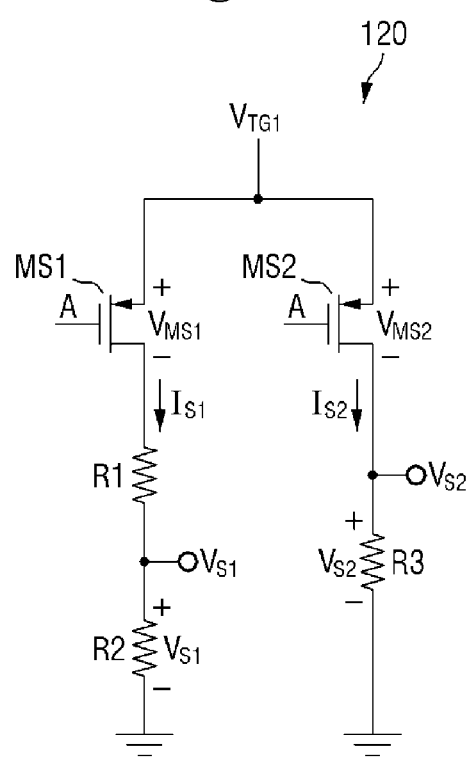
FIG. 3A is a circuit diagram illustrating a configuration of a voltage sensing circuit according to an exemplary embodiment.

FIG. 3A is a circuit diagram illustrating a configuration of a voltage sensing circuit 120 according to an exemplary embodiment. Hereinafter, the operation of the voltage sensing circuit 120 according to an exemplary embodiment will be described with reference to FIGS. 1 to 3A. However, repeated or redundant descriptions of the contents described with reference to FIGS. 1 and 2 may be omitted.

According to one or more exemplary embodiments, the magnitude of the first transistor MS1 may be k times the magnitude of the second transistor MS2 (where k is an integer greater than 1). The magnitude of the transistor may be expressed as a ratio of a width W of the gate to a length L of the gate. At this time, the length L of the gate may refer to a distance of a lower end of the gate, that is, a channel between the source and the drain, and the width W of the gate may refer to a length extending in a direction orthogonal to the length L of the gate. A magnitude S2 of the second transistor MS2 and a magnitude S1 of the first transistor MS1 may be expressed by the following Equations 1 and 2, respectively.

$$S2 = W_{MS2}/L_{MS2} \quad \text{[Equation 1]}$$

$$S1 = W_{MS1}/L_{MS1} = k \cdot (W_{MS2}/L_{MS2}) \quad \text{[Equation 2]}$$

Here, $W_{MS1}$ is a gate width of the first transistor MS1, $L_{MS1}$ is a gate length of the first transistor MS1, $W_{MS2}$ is a gate width of the second transistor MS2, and $L_{MS2}$ is a gate length of the second transistor MS2.

As illustrated, the first sensing current $I_{S1}$ is a current flowing from the first transistor MS1 to the first resistive element R1 and the second resistive element R2. The second sensing current IS2 is a current flowing from the second transistor MS2 to the third resistive element R3. Since the magnitude S1 of the first transistor MS1 is k times greater than the magnitude S2 of the second transistor MS2, the magnitude of the first sensing current $I_{S1}$ may have a value that is k times greater than the magnitude of the second sensing current $I_{S2}$. That is, the first sensing current $I_{S1}$ and the second sensing current $I_{S2}$ expressed as Equation 3 below may flow through a path including the first resistive element R1 and a path including the third resistive element R, respectively.

$$I_{S1} = k \cdot I_{S2} \quad \text{[Equation 3]}$$

The first sensing voltage $V_{S1}$ and the second sensing voltage $V_{S2}$, which are outputs of the voltage sensing circuit 120, may be defined by the voltage provided to both ends of the second resistive element R2 and the third resistive element R3, respectively. Therefore, the second sensing voltage $V_{S2}$ and the first sensing voltage $V_{S1}$ may be represented by Equations 4 and 5, respectively.

$$V_{S2} = I_{S2} \cdot R_3 \quad \text{[Equation 4]}$$

$$V_{S1} = I_{S1} \cdot R_2 = k \cdot I_{S2} \cdot R_2 \quad \text{[Equation 5]}$$

As assumed above, since a resistance value of the second resistive element R2 and a resistance value of the third resistive element R3 are the same, the first sensing voltage $V_{S1}$ may be expressed as following Equation 6, where k is an integer greater than 1. Thus, the first sensing voltage $V_{S1}$ becomes a voltage having a level that is always higher than the second sensing voltage $V_{S2}$.

$$V_{S1} = k \cdot I_{S2} \cdot R_2 = k \cdot V_{S2} \quad \text{[Equation 6]}$$

According to one or more exemplary embodiments, the first comparing circuit 130 receives the first sensing voltage $V_{S1}$ and the second sensing voltage $V_{S2}$ as an input, and may output the first monitoring output signal OUT_MC1 on the basis of the levels of the first sensing voltage $V_{S1}$ and the second sensing voltage $V_{S2}$. For example, when the level of the first sensing voltage $V_{S1}$ is higher than the level of the second sensing voltage $V_{S2}$, the first comparing circuit 130 generates and outputs the first signal as the first monitoring output signal OUT_MC1. Conversely, when the level of the first sensing voltage $V_{S1}$ is not higher than the level of the second sensing voltage $V_{S2}$, the first comparing circuit 130 may generate and output the second signal as the first monitoring output signal OUT_MC1. At this time, the first signal may be a signal having a level higher than the second signal.

Due to the characteristics of the current sensing circuit that is arranged in the current mirror structure and in which the magnitude S of the first transistor MS1 is formed to be k times greater than the magnitude S2 of the second transistor MS2, the magnitude of the first sensing current $I_{S1}$ is k times greater than the magnitude of the second sensing current $I_{S2}$. Thus, the first sensing voltage $V_{S1}$ always has a level that is higher than the level of the second sensing voltage $V_{S2}$. That is, when the first transistor MS1 and the second transistor MS2 operate in a saturation region, the first sensing voltage $V_{S1}$ always has a level higher than the level of the second sensing voltage $V_{S2}$, and the comparing circuit therefore generates and outputs the first signal. At this time, the first signal may refer to information in which the first target voltage $V_{TG1}$ is included in the first reference voltage range.

FIG. 3B is a graph illustrating a change in the second sensing voltage according to the level of the first target voltage. Hereinafter, a change in the second sensing voltage $V_{S2}$ due to a decrease in the level of the first target voltage $V_{TG1}$ will be described with reference to FIGS. 1, 2, and 3A to 3B.

The first target voltage $V_{TG1}$ may satisfy the sum of the second sensing voltage $V_{S2}$ provided to both ends of the third resistive element R3 and the second transistor voltage $V_{MS2}$ provided to both ends of the second transistor $V_{S2}$, which may be expressed as Equation 7 below.

$$V_{TG1} = V_{S2} + V_{MS2} \quad \text{[Equation 7]}$$

The second sensing current $I_{S2}$ is kept constant due to the characteristics of the current mirror structure, and thus, the second sensing voltage $V_{S2}$ is also kept constant. That is, the second sensing voltage $V_{S2}$ is not influenced by the first target voltage $V_{TG1}$, and the second transistor voltage VMS2 changes in accordance with the change in the first target voltage $V_{TG1}$.

When the first target voltage $V_{TG1}$ is lowered due to an external attack or the like, the operation of the first transistor MS1 and the second transistor MS2 may be switched from a saturation region into a linear region at a specific time (e.g., a time t0). At this time, the time t0 may refer to a time at which the first target voltage $V_{TG1}$ deviates from a first reference voltage range. Specifically, the time t0 may refer to a time at which the first target voltage $V_{TG1}$ becomes equal to the first reference voltage $V_{REF1}$.

As illustrated, when the first target voltage $V_{TG1}$ decreases, the second transistor voltage $V_{MS2}$ decreases, and the operation of the first transistor MS1 and the second transistor MS2 switches from the saturation region into the linear region at the time t0. As a result, the second transistor voltage $V_{MS2}$ rapidly drops and the second sensing voltage $V_{S2}$ rapidly rises. Also, the voltage provided to the node A, that is, the reference bias voltage $V_A$ applied to the gates of the first transistor MS1 and the second transistor MS2 rapidly drops, and the characteristics of the current mirror are no longer maintained. In the linear region, the first transistor voltage $V_{MS1}$ and the second transistor voltage $V_{MS2}$ applied to both ends of the first transistor MS1 and the second transistor MS2 have substantially the same level. As a result, the first sensing voltage $V_{S1}$ may be expressed as Equation 8 below.

$$V_{S1}=(V_{TG1}-V_{MS1})\cdot(R1/(R1+R2))\approx(V_{TG1}-V_{MS2})\cdot(R1/(R1+R2))=V_{S2}\cdot(R1/(R1+R2)) \quad \text{[Equation 8]}$$

Referring to Equation 8, since the first sensing voltage $V_{S1}$ has a level of R1/(R1+R2) times the second sensing voltage VS2, the first sensing voltage $V_{S1}$ has a value smaller than the second sensing voltage $V_{S2}$. As described above, when the first sensing voltage $V_{S1}$ is greater than the second sensing voltage $V_{S2}$, the first comparing circuit 130 outputs the first signal as the first monitoring output signal OUT_MC1. Conversely, when the first sensing voltage $V_{S1}$ is not greater than the second sensing voltage $V_{S2}$, the first comparing circuit 130 outputs the second signal as the second monitoring output signal. In this case, the first comparing circuit 130 outputs the second signal as the first monitoring output signal OUT_MC1.

In summary, when the first target voltage $V_{TG1}$ deviates from the range of the first voltage reference (for example, when the first target voltage $V_{TG1}$ drops to a level lower than the first reference voltage $V_{REF1}$), the operating characteristics of the first transistor MS1 and the second transistor MS2 of the voltage sensing circuit 120 change from the saturation region to the linear region, and the characteristics of the current mirror are no longer maintained. As a result, the voltage level of the first sensing voltage $V_{S1}$ becomes lower than the voltage level of the second sensing voltage $V_{S2}$, and the first comparing circuit 130 outputs the second signal as the first monitoring output signal OUT_MC1.

In a case where the level of the first target voltage $V_{TG1}$ applied to the semiconductor device 10 drops below a specific level due to an external attack or a problem of a power supply connected to the first monitoring circuit 100, the semiconductor device 10 according to an exemplary embodiment may autonomously recognize and process the situation, by generating the second signal as the first monitoring output signal OUT_MC1. Also, since the first sensing signal and the second sensing signal generated via the voltage sensing circuit 120 having the current mirror structure are utilized, by determining whether the first target voltage $V_{TG1}$ is included in the first reference voltage range without using other inputs (for example, other reference voltages applied from the outside) compared with the first target voltage $V_{TG1}$, it is possible to solve the problem that other inputs are attached from the outside and different results are obtained.

Figure 4:
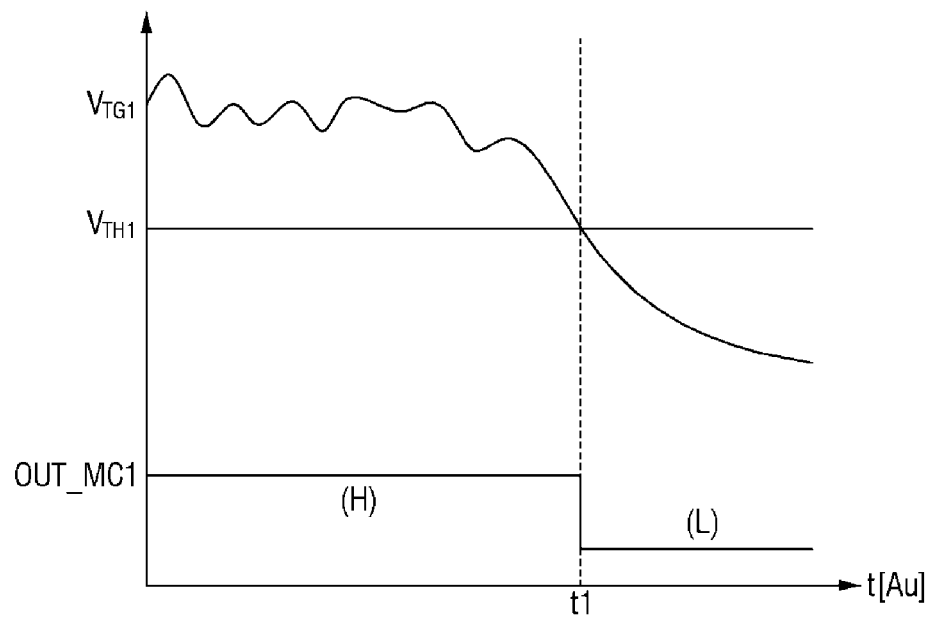
FIG. 4 is a graph illustrating a first monitoring output signal corresponding to a first target voltage.

FIG. 4 is a graph illustrating a first monitoring output signal corresponding to a first target voltage.

Referring to FIG. 4, when the level of the input first target voltage $V_{TG1}$ drops below the first threshold voltage $V_{TH1}$, the first monitoring circuit 100 according to an exemplary embodiment may output the second signal as the first monitoring output signal OUT_MC1. The first signal may be a signal having a level higher than the second signal. The first threshold voltage $V_{TH1}$ may correspond to a first reference voltage $V_{REF1}$ of FIG. 3B.

In a region before the time t1, the first target voltage $V_{TG1}$ applied to the first monitoring circuit 100 has a level higher than the first threshold voltage $V_{TH1}$, and the first transistor MS1 and the second transistor MS2 of the voltage sensing circuit 120 operate in the saturation region. As a result, the first sensing voltage $V_{S1}$ always has a level higher than the second sensing voltage $V_{S2}$, and the comparing circuit outputs the first signal as the first monitoring output signal OUT_MC1. The first signal may include information in which a first target voltage $V_{TG1}$ applied to the first monitoring circuit 100 is included in a predetermined reference voltage range, and thus, the first monitoring circuit 100 may determine by itself that the input first target voltage $V_{TG1}$ is in a steady state.

The first target voltage $V_{TG1}$ drops to a level lower than the first threshold voltage $V_{TH1}$ in the region after the time t1, and the operating regions of the first transistor MS1 and the second transistor MS2 of the voltage sensing circuit 120 are changed. That is, the operating characteristics are changed from the saturation region to the linear region after the time t1. As a result, the characteristics of the current mirror applied to the voltage sensing circuit 120 are no longer maintained, and the first sensing voltage $V_{S1}$ has a level lower than that of the second sensing voltage $V_{S2}$. The comparing circuit generates the first monitoring output signal OUT_MC1 on the basis of the levels of the first sensing voltage $V_{S1}$ and the second sensing voltage $V_{S2}$, and in this case, the comparing circuit outputs the second signal as the first monitoring output signal OUT_MC1. The second signal includes information in which (or indicating that) the first target voltage $V_{TG1}$ applied to the first monitoring circuit 100 is not included in the predetermined reference voltage range, and thus, the first monitoring circuit 100 determines by itself that the first target voltage $V_{TG1}$ is not in the steady state, and may execute the subsequent processing operation thereof. That is, the first monitoring circuit 100 may determine by itself that the input voltage (for example, the first target voltage $V_{TG1}$) is not in the steady state for reasons such as abnormality of power supply, external attack and the like.

In particular, by determining whether the first target voltage $V_{TG1}$ is in a steady state only with reference to the first target voltage $V_{TG1}$ that is a determination target, and by not requiring another comparison target, it is possible to solve the problem that a comparison target (for example, a signal applied from the outside) for determination of the first target voltage $V_{TG1}$ is attacked and accurate determination of the first target voltage $V_{TG1}$ is disturbed.

Figure 5:
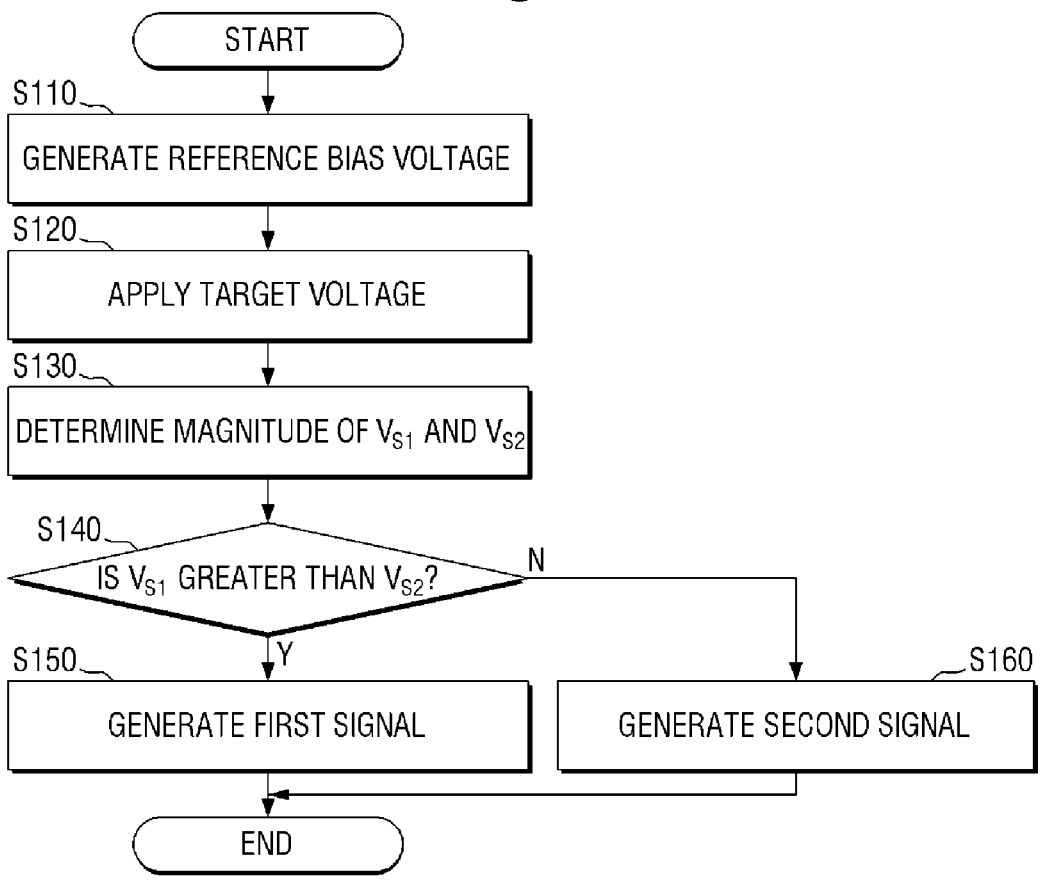
FIG. 5 is a flowchart illustrating an operation of a semiconductor device according to an exemplary embodiment.

FIG. 5 is a flowchart illustrating an operation of a semiconductor device 10 according to an exemplary embodiment. Hereinafter, a process in which the first monitoring circuit 100 according to an exemplary embodiment determines the status information of the first target voltage $V_{TG1}$ will be described with reference to FIGS. 1, 2, 3A to 3B, 4, and 5.

Referring to FIGS. 1, 2, 3A to 3B, 4, and 5, the semiconductor device 10 may include a first monitoring circuit 100 capable of determining the status of an input voltage by itself. The reference bias voltage $V_A$ to be applied to the voltage sensing circuit 120 may be generated in operation S110. Specifically, since the reference bias voltage $V_A$ is generated by the reference voltage generating circuit 110, and the gates of the first transistor MS1 and the second transistor MS2 of the voltage sensing circuit 120 share a node in which the reference bias voltage $V_A$ is generated, the characteristics of the current mirror may be applied to the voltage sensing circuit 120.

In operation S120, the first target voltage $V_{TG1}$ may be applied to the first monitoring circuit 100. The first monitoring circuit 100 may generate the first sensing voltage $V_{S1}$ and the second sensing voltage $V_{S2}$ on the basis of the input first target voltage $V_{TG1}$. For convenience of explanation, it is illustrated that operation S120 is executed after operation S110 is executed. It is understood, however, that one or more other exemplary embodiments are not limited thereto, and the order of operation S110 and operation S120 may be changed.

In operation S130, the magnitudes of the first sensing voltage $V_{S1}$ and the second sensing voltage $V_{S2}$ are determined. That is, the first monitoring circuit 100 may determine the level of the first sensing voltage $V_{S1}$ and the level of the second sensing voltage $V_{S2}$. It may be determined whether the magnitude of the first sensing voltage $V_{S1}$ has a value larger than that of the magnitude of the second sensing voltage $V_{S2}$ in operation S140.

Thereafter, when (or based on determining) the magnitude of the first sensing voltage $V_{S1}$ has a value larger than that of the magnitude of the second sensing voltage $V_{S2}$, the first signal may be generated as the first monitoring output signal OUT_MC1 (operation S150). On the other hand, when (or based on determining) the magnitude of the first sensing voltage $V_{S1}$ has a value smaller than the magnitude of the second sensing voltage $V_{S2}$, the second signal may be generated as the first monitoring output signal OUT_MC1 (operation S160). At this time, the first signal may include information in which the first target signal is in a steady state, and the second signal may include information in which the first target signal is not in a steady state.

Figure 6:
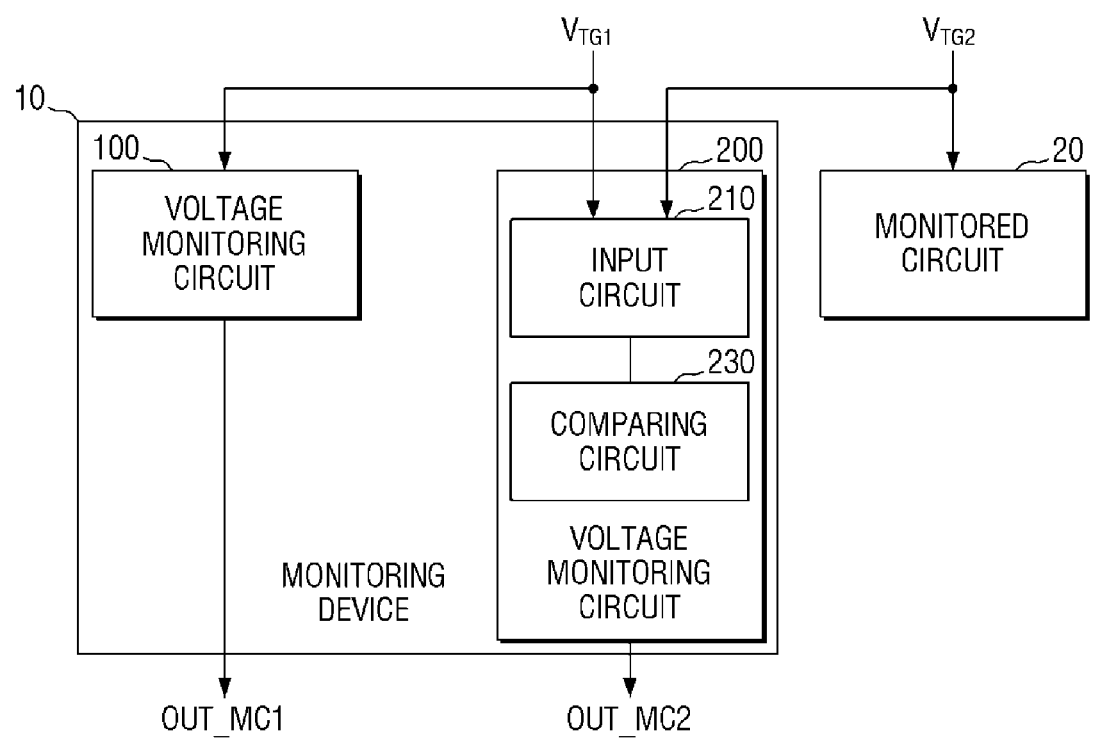
FIG. 6 is a block diagram schematically illustrating a configuration of a semiconductor device including a first monitoring circuit and a second monitoring circuit according to an exemplary embodiment.

FIG. 6 is a block diagram schematically illustrating a configuration of a semiconductor device 10 including a first monitoring circuit 100 and a second monitoring circuit 200 according to an exemplary embodiment.

The first monitoring circuit 100 described below has the same (or similar) configuration as the first monitoring circuit 100 described above with reference to FIGS. 1, 2, 3A to 3B, 4, and 5, and may perform the same or similar operations. Hereinafter, repeated or redundant description of the contents provided above with reference to FIGS. 1, 2, 3A to 3B, 4, and 5 may be omitted.

Referring to FIG. 6, the semiconductor device 10 according to an exemplary embodiment may include a first monitoring circuit 100 and a second monitoring circuit 200 (e.g., voltage monitoring circuit). The second monitoring circuit 200 may include an input circuit 210 and a second comparing circuit 230. The second monitoring circuit 200 may receive the first target voltage $V_{TG1}$ and the second target voltage $V_{TG2}$, and may output a second monitoring output signal OUT_MC2 on the basis thereof. The second monitoring output signal OUT_MC2 may be a third signal or a fourth signal. At this time, the third signal may be a signal having a level lower than that of the fourth signal. The second target voltage $V_{TG2}$ may be the voltage applied to the target circuit 20. At this time, the target circuit 20 may be a circuit to be monitored by the second monitoring circuit 200. That is, the second monitoring circuit 200 may receive the second target voltage $V_{TG2}$ applied to the target circuit 20, and may determine the status information of the second target voltage $V_{TG2}$.

The semiconductor device 10 and the target circuit 20 may be mounted on the same semiconductor chip. It is understood that any type of circuit to which voltage is applied, such as a processor, a one-time programmable (OTP) memory, and a main memory, may be applied or implemented as the target circuit 20. In recent years, attacks for arbitrarily changing a voltage level to a lower voltage with respect to a specific voltage among various kinds of voltages applied to the target circuit 20, and measuring the level of the output voltage to find out the output voltage corresponding to the input voltage through the changed output voltage have been frequently made. Therefore, a scheme capable of determining whether the voltage level input to the target circuit 20 drops below a specific condition is required.

According to one or more exemplary embodiments, the second monitoring output signal OUT_MC2 may include information as to whether the second target voltage $V_{TG2}$ is in a steady state. At this time, if the second target voltage VTG2 is determined to be in the steady state, a third signal is generated as the second monitoring output signal OUT_MC2. Conversely, if the second target voltage VTG2 is not determined to be in the steady state, a fourth signal may be generated as the monitoring output signal OUT_MC2.

The second monitoring output signal OUT_MC2 may indicate whether the second target voltage $V_{TG2}$ is included in the second reference voltage range. At this time, if it is determined that the second target voltage $V_{TG2}$ is included in the second reference voltage range, the third signal may be generated as the second monitoring output signal OUT_MC2. Conversely, if it is not determined that the second target voltage $V_{TG2}$ is included in the second reference voltage range, the fourth signal may be generated as the second monitoring output signal OUT_MC2.

Figure 7:
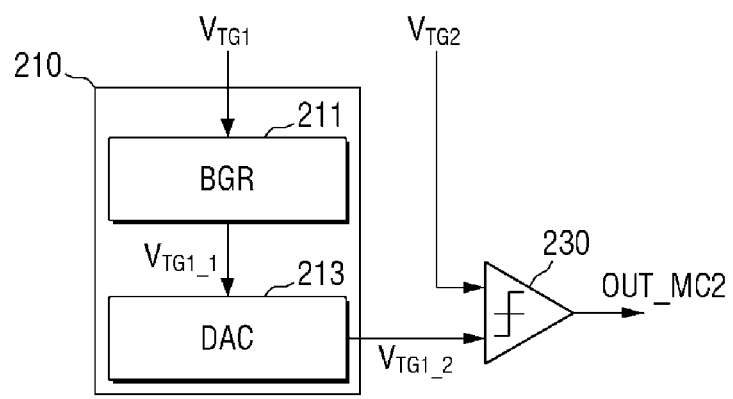
FIG. 7 is a diagram illustrating a configuration of a second monitoring circuit according to an exemplary embodiment.

FIG. 7 is a diagram illustrating a configuration of a second monitoring circuit 200 according to an exemplary embodiment.

Referring to FIGS. 6 and 7, the input circuit 210 may include a bandgap reference (BGR) circuit 211 and a digital to analog converter (DAC) circuit 213. The input circuit 210 may receive the first target voltage $V_{TG1}$, and the first target voltage $V_{TG1}$ may be input to the BGR circuit 211. The BGR circuit 211 receives the first target voltage $V_{TG1}$, and when (or based on determining) the level of the first target voltage $V_{TG1}$ is included within the first conversion range, the BGR circuit 211 may convert and output the first target voltage $V_{TG1}$ to a first converted voltage $V_{TG1\_1}$. The DAC circuit 213 receives the first converted voltage $V_{TG1\_1}$ converted and output by the BGR circuit 211, converts and outputs the first converted voltage $V_{TG1\_1}$ into an analog signal, and may generate and output a second converted voltage $V_{TG1\_2}$ obtained by converting the level of the first converted voltage $V_{TG1\_1}$ with a predetermined ratio.

In summary, the BGR circuit 211 generates the first converted voltage $V_{TG1\_1}$ on the basis of the first target voltage $V_{TG1}$ applied to the second monitoring circuit 200, and the DAC circuit 213 may receive the first converted voltage $V_{TG1\_1}$, and convert the first converted voltage $V_{TG1\_1}$ into an analog signal, and convert the level of the first converted voltage $V_{TG1\_1}$ with a predetermined ratio to output the second converted voltage $V_{TG1\_2}$.

According to an exemplary embodiment, the second comparing circuit 230 receives the second target voltage $V_{TG2}$ and the second converted voltage $V_{TG1\_2}$, and may generate and output the second monitoring output signal OUT_MC2 on the basis of the magnitude of the second target voltage $V_{TG2}$ and the magnitude of the second converted voltage $V_{TG1\_2}$. For example, in the case where the magnitude of the second target voltage $V_{TG2}$ is larger than the magnitude of the second converted voltage $V_{TG1\_2}$, the third signal is output as the second monitoring output signal OUT_MC2. Conversely, in the case where the magnitude of the second target voltage $V_{TG2}$ is not larger than the magnitude of the second converted voltage $V_{TG1\_2}$, the fourth signal may be output as the second monitoring output signal OUT_MC2. At this time, the third signal may be a signal having a level lower than that of the fourth signal.

Figure 8A:
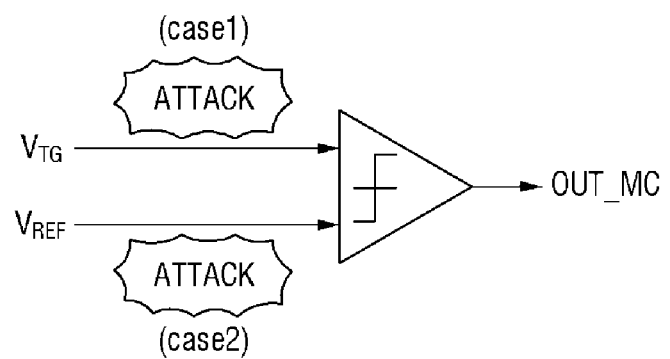
FIG. 8A is a diagram illustrating a case where a target voltage or a reference voltage is attacked.
Figure 8B:
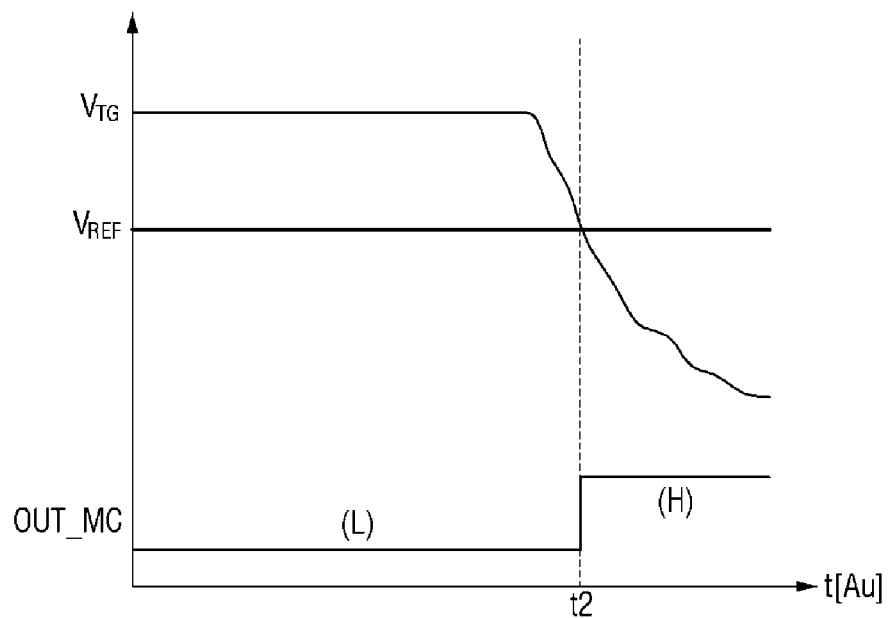
FIG. 8B is a graph illustrating a monitoring output signal that is output in a case where a target voltage is attacked.

FIG. 8A is a diagram illustrating a case where the target voltage or the reference voltage is attacked, FIG. 8B is a graph illustrating a monitoring output signal that is output in the case where the target voltage is attacked, and FIG. 8C is a graph illustrating a monitoring output signal that is output in the case where both the target voltage and the reference voltage are attacked. Hereinafter, problems of a related art method of determining an attack on the target voltage $V_{TG}$ will be examined with reference to FIGS. 8A to 8C.

Referring to FIG. 8A, a case (case 1) where the voltage applied to the target circuit to be attacked is changed to trace the output voltage of the target circuit and obtain information, and a case (case 2) where the reference voltage $V_{REF}$ (for example, the power supply voltage of the monitoring circuit) applied to a device for monitoring the voltage applied to the target circuit is attacked to change the voltage level occur.

Referring to FIG. 8B, in the case 1, it is possible to defend an attack of changing the level of the target voltage $V_{TG}$. Specifically, when the target voltage $V_{TG}$ is attacked and the level of the target voltage $V_{TG}$ becomes lower than the level of the reference voltage $V_{REF}$, it may be determined that there is an abnormality in the target voltage $V_{TG}$ by outputting a high level of signal for the monitoring output signal OUT_MC. As illustrated, in a region (a region up to the time t2) in which the level of the target voltage $V_{TG}$ has a value higher than the level of the reference voltage $V_{REF}$, by outputting a signal of a low level as the monitoring output signal OUT_MC, it is possible to determine that the target voltage $V_{TG}$ is in a steady state. Thereafter, in a region (a region after the time t2) in which the level of the target voltage VT has a value lower than the level of the reference voltage $V_{REF}$, by outputting a signal of a high level as the monitoring output signal OUT_MC, it is possible to determine that the target voltage $V_{TG}$ is not in the steady state, and a corresponding processing operation therefor may be executed.

Referring to FIG. 8C, in the case 2, that is, in the case where both the target voltage $V_{TG}$ and the reference voltage $V_{REF}$ are attacked, an attack on the target voltage $V_{TG}$ may not be determined or identified in the related art. As illustrated, it is assumed that the attack on the target voltage $V_{TG}$ is started before the time t3, the level of the target voltage $V_{TG}$ is lowered, and the level of the target voltage $V_{TG}$ becomes the same as the level of the reference voltage $V_{REF}$ at the time t3. Thereafter, it is assumed that an attack on the reference voltage $V_{REF}$ is started in the section between the time t3 and the time t4, the level of the reference voltage $V_{REF}$ becomes low, the level of the target voltage $V_{TG}$ becomes the same as the level of the reference voltage $V_{REF}$ again at the time t4, and the level of the target voltage $V_{TG}$ has a value higher than the level of the reference voltage $V_{REF}$ in the region after the time t4.

In the section before the time t3, a low level of monitoring output signal OUT_MC is output and the target voltage $V_{TG}$ may be determined to be in the steady state. In the section between the time t3 and the time t4, the target voltage $V_{TG}$ has a level lower than the reference voltage $V_{REF}$. Thus, a high level of the monitoring output signal OUT_MC is output, the target voltage $V_{TG}$ may be determined not to be in the steady state, and a corresponding processing operation therefor may be executed.

In the section after the time t4, as the target voltage $V_{TG}$ has a level higher than the reference voltage $V_{REF}$, a low level of monitoring signal is output. That is, even though the target voltage $V_{TG}$ is attacked to have a level lower than the predetermined standard, and a high level of the monitoring output signal OUT_MC including information or indicating that the target voltage $V_{TG}$ is not in the steady state should be generated, since the reference voltage $V_{REF}$ that is the determination standard of the target voltage $V_{TG}$ is lowered, the target voltage $V_{TG}$ is incorrectly determined to be in the steady state.

Therefore, due to an attack of the reference voltage $V_{REF}$ that is a reference for determining whether the voltage level of the target voltage $V_{TG}$ drops below a specific condition, even though the target voltage $V_{TG}$ drops below a specific condition, there is a case where information or an indication of the steady state may be erroneously transferred or provided.

Figure 9:
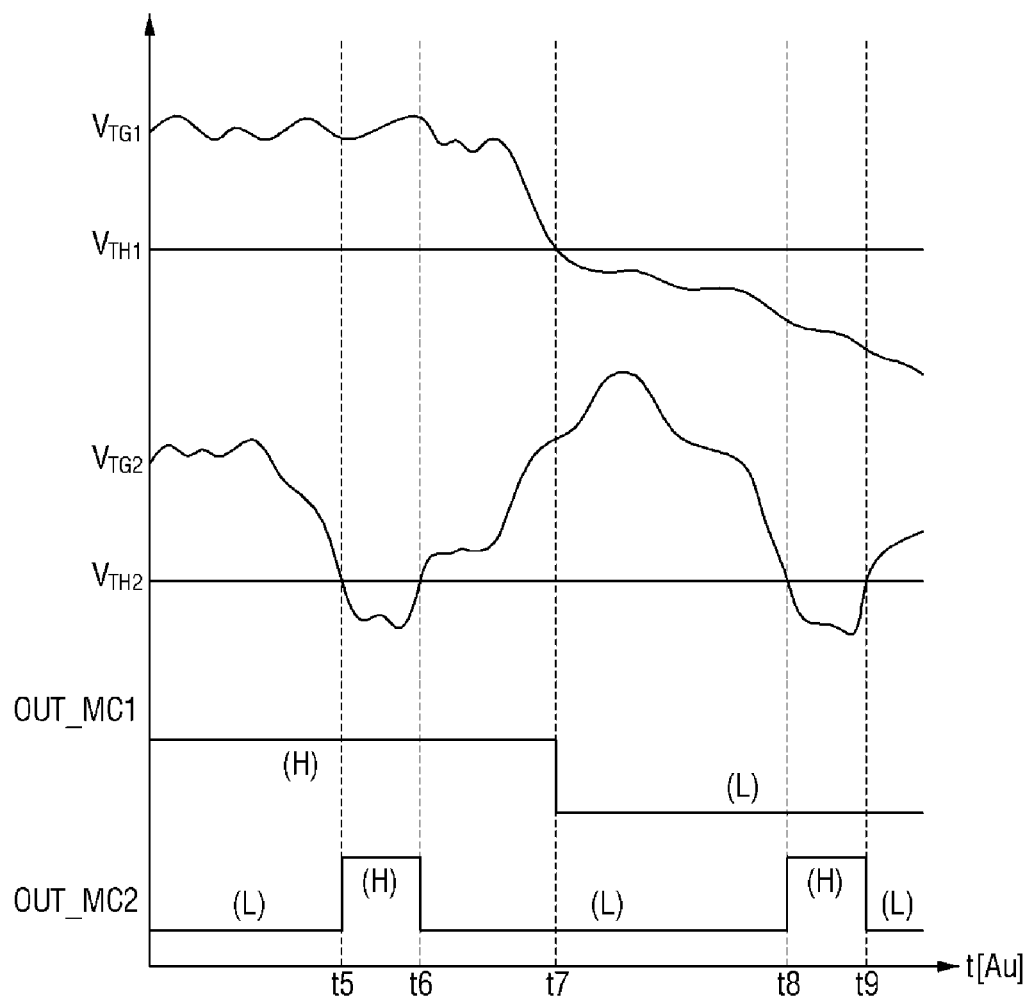
FIG. 9 is a graph illustrating a first monitoring output signal and a second monitoring output signal that are output in accordance with a first target voltage and a second target voltage according to an exemplary embodiment.

FIG. 9 is a graph illustrating a first monitoring output signal and a second monitoring output signal that are output depending on a first target voltage and a second target voltage according to an exemplary embodiment.

Referring to FIG. 9, the semiconductor device 10 according to an exemplary embodiment may generate the first monitoring output signal OUT_MC1 and the second monitoring output signal OUT_MC2, thereby making it is possible to more accurately determine the attack on the target voltage.

Specifically, in a case where the first target voltage $V_{TG1}$ is determined to have a level higher than the first threshold voltage $V_{TH1}$, the first monitoring circuit 100 outputs the first signal. Conversely, in the case where the first target voltage $V_{TG1}$ is determined to not have a level higher than the first threshold voltage $V_{TH1}$, the first monitoring circuit 100 may output the second signal. At this time, it is assumed that the first signal is a signal having a level higher than the second signal (though it is understood that one or more other exemplary embodiments are not limited thereto). In the section before the time t7, since the voltage level of the first target signal is higher than the first threshold voltage $V_{TH1}$, the first monitoring circuit 100 outputs the first signal as the first monitoring output signal OUT_MC1. The level of the first target signal becomes the same as the level of the first threshold voltage $V_{TH1}$ at the time t7, and the level of the first target signal has a value lower than that of the first threshold voltage $V_{TH1}$ in the section after the time t7. As a result, the first monitoring circuit 100 outputs the second signal as the first monitoring output signal OUT_MC1 in the section after the time t7.

When (or based on) the second target voltage $V_{TG2}$ is determined to have a level higher than the second threshold voltage $V_{TH2}$, the second monitoring circuit 200 outputs the third signal as the second monitoring output signal OUT_MC2. Conversely, in the case where the second target voltage $V_{TG2}$ is determined to not have a level higher than the second threshold voltage $V_{TH2}$, the second monitoring circuit 200 may output the fourth signal as the second monitoring output signal OUT_MC2. At this time, it is assumed that the third signal is a signal having a level lower than that of the fourth signal (though it is understood that one or more other exemplary embodiments are not limited thereto). According to an exemplary embodiment, the second threshold voltage $V_{TH2}$ is a voltage based on the first target voltage $V_{TG1}$. For example, the second threshold voltage $V_{TH2}$ may be the first target voltage $V_{TG1}$. As another example, the second threshold voltage $V_{TH2}$ may be a first converted voltage $V_{TG1\_1}$ that is output by conversion of the first target voltage $V_{TG1}$ by the BGR circuit 211. As still another example, the second threshold voltage $V_{TH2}$ may be a second converted voltage $V_{TG1\_2}$ that is output by conversion of the first converted voltage $V_{TG1\_1}$ by the DAC circuit 213.

In the section before the time t5, since the second target voltage $V_{TG2}$ has a level higher than the second threshold voltage $V_{TH2}$, the third signal is output as the second monitoring output signal OUT_MC2. Since the level of the second target voltage $V_{TG2}$ becomes lower than the second threshold voltage $VT_{H2}$ in the section between the time t5 and the time t6, the fourth signal is output as the second monitoring output signal OUT_MC2. Since the second target voltage $V_{TG2}$ is determined as a voltage having a level higher than the second threshold voltage $V_{TH2}$ again in the section between the time t6 and the time t8, the third signal is output as the second monitoring output signal OUT_MC2. Thereafter, since the second target voltage $V_{TG2}$ becomes lower than the second threshold voltage $V_{TH2}$ again in the section between the time t8 and the time t9, the fourth signal is output, and the third signal is output again as the second monitoring output signal OUT_MC2 in the section after the time t9.

Considering the second monitoring output signal OUT_MC2, in the section between the time t5 and the time t6, and the section between the time t8 and the time t9, the fourth signal, that is, a signal including information or indicating that the second target voltage $V_{TG2}$ is not in the steady state is generated. In the remaining sections, a third signal, that is, a signal including information or indicating that the second target voltage $V_{TG2}$ is in the steady state is generated. As illustrated, the level of the first target voltage $V_{TG1}$ decreases due to an attack on the first target voltage $V_{TG1}$ and the like in the section between the time t6 and the time t7, and the target voltage has a level lower than that of the first threshold voltage $V_{TH1}$ in the section after the time t7. That is, in the section between the time t6 and the time t8 in which the second target signal is determined to be in the steady state by the second monitoring signal, and in the section after the time t9, even though the second target voltage $V_{TG2}$ is not in the steady state, there is a high possibility that the third signal is output as the second monitoring output signal OUT_MC2 as the first target voltage $V_{TG1}$ becomes low.

By simultaneously operating the second monitoring circuit 200 for determining the level of the second target voltage $V_{TG2}$ and the first monitoring circuit 100 for determining the level of the first target voltage $V_{TG1}$, which is a determination standard (or a basis of the determination standard) of the second target voltage $V_{TG2}$, the accuracy of determination on the second target voltage $V_{TG2}$ can be improved according to an exemplary embodiment. Specifically, by generating the second signal including information that the first target voltage $V_{TG1}$ is not in the steady state as the first monitoring output signal OUT_MC1 in the section after the time t7, even though the second monitoring output signal OUT_MC2 is output as the third signal in the section after the time t7, it is possible to determine that the second target voltage $V_{TG2}$ is not in the steady state. Therefore, by determining that the second target voltage $V_{TG2}$ is not in the steady state in the section between the time t7 and the time t8 at which the third signal is output as the second monitoring output signal OUT_MC2, and even in the section after the time t9, it is possible to more accurately determine the attack on the second target voltage $V_{TG2}$ applied to the target circuit 20.

In the first monitoring circuit 100 according to an exemplary embodiment, by determining the attack of the first target voltage $V_{TG1}$, that is, whether the voltage level is changed, only with the first target voltage $V_{TG1}$ without requiring an external reference voltage, using a current mirror structure, it is possible to more accurately determine the attack on the first target voltage $V_{TG1}$. By simultaneously monitoring the external attack of the first target voltage $V_{TG1}$ and the second target voltage $V_{TG2}$, it is possible to effectively defend and cope with the attack on the voltage applied to the target circuit 20.

Figure 10:
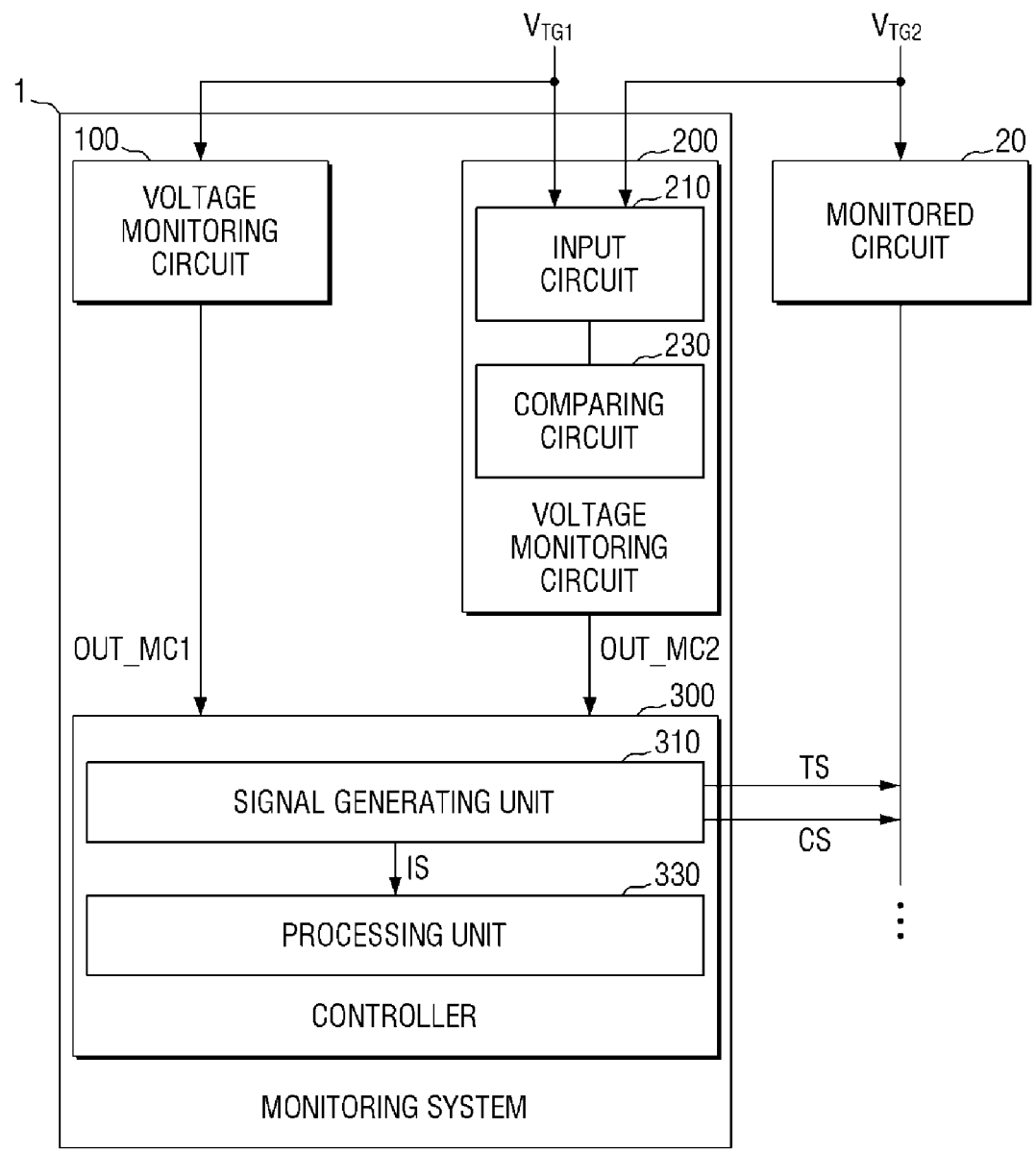
FIG. 10 is a block diagram schematically illustrating a configuration of a semiconductor system according to an exemplary embodiment.

FIG. 10 is a block diagram schematically illustrating a configuration of a semiconductor system 1 according to an exemplary embodiment. Hereinafter, repeated or redundant descriptions of the contents provided above with reference to FIGS. 1, 2, 3A to 3B, 4 to 7, 8A to 8C, and 9 may be be omitted.

Referring to FIG. 10, the semiconductor system 1 may include a first monitoring circuit 100, a second monitoring circuit 200 and a controller 300. The controller 300 may include a signal generating unit 310 (e.g., signal generator) and a processing unit 330 (e.g., processor or processing element).

The controller 300 receives the first monitoring output signal OUT_MC1 from the first monitoring circuit 100 and receives the second monitoring output signal OUT_MC2 from the second monitoring circuit 200, and may determine the status information of the second target voltage $V_{TG2}$ on the basis thereof. At this time, the second target voltage $V_{TG2}$ may be a voltage applied as any input of a plurality of inputs applied to the target circuit 20 to be monitored.

The controller 300 may determine the level of the second monitoring output signal OUT_MC2 after determining the level of the first monitoring output signal OUT_MC1. For example, when the first monitoring output signal OUT_MC1 is the first signal, the second monitoring output signal OUT_MC2 is determined. When the first monitoring output signal OUT_MC1 is the second signal, the second monitoring output signal OUT_MC2 may not be determined. Since the first signal includes the information that or indicates that the first target voltage $V_{TG1}$ is in the steady state, the first monitoring signal OUT_MC2 is determined and whether the second target voltage $V_{TG2}$ is in the steady state is determined. At this time, when (or based on) the second monitoring output signal OUT_MC2 is the third signal, the second target voltage $V_{TG2}$ may be determined to be in the steady state, and when (or based on) the second monitoring output signal OUT_MC2 is the fourth signal, the second target voltage $V_{TG2}$ may be determined not to be in the steady state.

When (or based on) the first monitoring output signal OUT_MC1 is the second signal, the second target output voltage OUT_MC2 is not determined, and the second target voltage $V_{TG2}$ may be determined to not be in the steady state. That is, since the second signal includes information or indicates that the first target voltage $V_{TG1}$ is not in the steady state, there is a high possibility that the second monitoring output signal OUT_MC2 is not accurate information. Thus, in this case, it is possible to determine that the first target voltage $V_{TG1}$ and the second target voltage $V_{TG2}$ are not in the steady state for the reason of an external attack or the like, regardless of the second monitoring output signal OUT_MC2.

When (or based on) the second target voltage VTG2 is determined not to be in the steady state, the signal generating unit 310 may generate and output at least one of an interrupt signal IS, a tag signal TS and a variable signal CS.

The interrupt signal IS may include information on or indicate whether the target circuit 20 operates under an unsteady condition. For example, when the interrupt signal IS has a logical low level and then is changed to a logical high level, it is possible to determine that the target circuit 20 is operating under the unsteady condition in a section in which the interrupt signal IS has the logical high level. According to one or more exemplary embodiments, the interrupt signal IS generated by the signal generating unit 310 is transferred to the processing unit 330, and when it is determined that the target circuit 20 is operating under the unsteady condition by the interrupt signal IS, the processing unit 330 may perform a corresponding processing operation on the target circuit 20.

The tag signal TS may be a signal for attaching a tag indicating the unsteady condition to the output signal of the target circuit 20. For example, the signal generating unit 310 may not attach the tag to the output signal of the target circuit 20 in a section in which the tag signal TS has a logical low level, that is, under the steady condition. For example, the signal generating unit 310 may attach a tag to the output signal of the target circuit 20 in a section in which the tag signal TS has a logical high level, that is, under the unsteady condition.

The variable signal CS may be a signal for changing the output signal of the target circuit 20 to a signal in which security is guaranteed. For example, if the output signal of the target circuit 20 is '0000', it is assumed that the security protection function of the semiconductor system 1 is enabled. The signal generating unit 310 may not change the output signal of the target circuit 20 in a section in which the variable signal CS has the logical low level, that is, under the steady condition. Conversely, the signal generating unit 310 may change the output signal of the target circuit 20 to '0000' in a section in which the variable signal CS has the logical high level, that is, under the unsteady condition.

Figure 11:
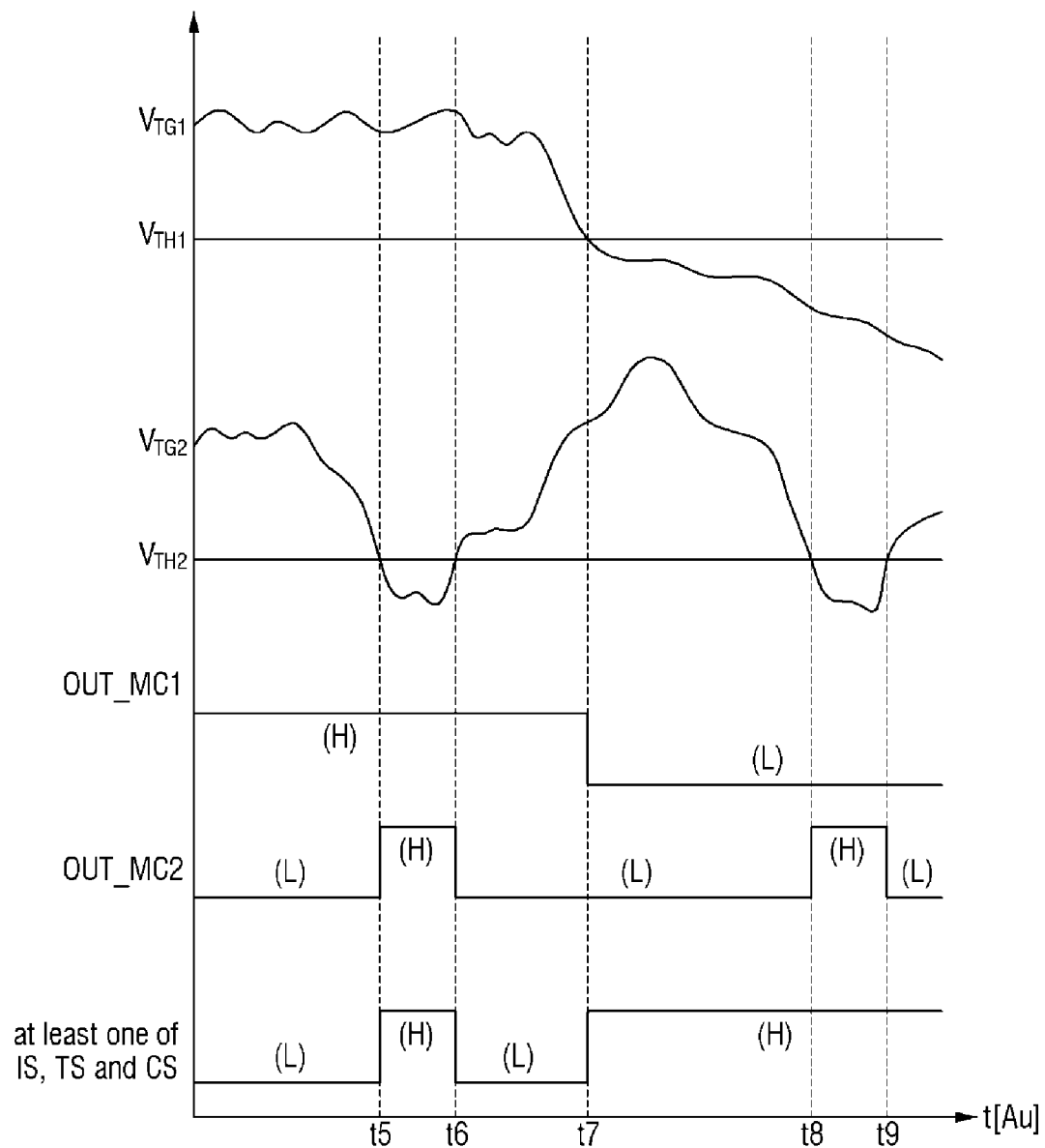
FIG. 11 is a graph illustrating a signal that is output on the basis of a first monitoring output signal and a second monitoring output signal according to an exemplary embodimen.

FIG. 11 is a graph illustrating signals that are output on the basis of a first monitoring output signal OUT_MC1 and a second monitoring output signal OUT_MC2 according to an exemplary embodiment.

Referring to FIGS. 10 and 11, when the second target voltage $V_{TG2}$ is determined to be under the unsteady condition, the controller 300 may output the interrupt signal IS, the tag signal TS and/or the variable signal CS to have a logical high level. That is, as described above with reference to FIG. 9, since the second target signal is determined to not be in the steady state in the section between the time t5 and the time t6 and the section after the time t7, and as a result, the target circuit 20 is determined to operate under the unsteady condition, at least one of the interrupt signal IS, the tag signal TS and the variable signal CS may be output in a logical high state in the section between the time t5 and the time t6 and the section after the time t7.

It is understood that many variations and modifications may be made to the exemplary embodiments without substantially departing from the principles of the present inventive concept. Therefore, the exemplary embodiments described above are used in a generic and descriptive sense only and not for purposes of limitation.

What is claimed is:

1. A semiconductor device comprising:
   a voltage sensing circuit to which a target voltage is applied from an input node, and configured to output a first sensing voltage and a second sensing voltage based on the target voltage; and
   a comparing circuit configured to generate a monitoring output signal corresponding to the target voltage based on a level of the first sensing voltage and a level of the second sensing voltage,
   wherein the voltage sensing circuit comprises:
     a first transistor including a gate to receive a reference bias voltage from a reference voltage generating circuit, a source connected to the input node, and a drain connected to one end of a first resistive element;
     a second transistor provided in a current mirror structure with the first transistor, and including a gate to receive the reference bias voltage from the reference voltage generating circuit, a source connected to the input node, and a drain connected to a third resistive element; and
     a second resistive element connected to an other end of the first resistive element, and
   wherein the first sensing voltage is a voltage provided to both ends of the second resistive element, and the second sensing voltage is a voltage provided to both ends of the third resistive element.

2. The semiconductor device of claim 1, further comprising:
   a reference voltage generating circuit configured to generate the reference bias voltage,
   wherein a node to which the reference bias voltage generated by the reference voltage generating circuit is provided is connected to the gate of the first transistor and the gate of the second transistor.

3. The semiconductor device of claim 1, wherein:
   the comparing circuit is configured to output a first signal as the monitoring output signal based on the level of the first sensing voltage being less than the level of the second sensing voltage;
   the comparing circuit is configured to output a second signal as the monitoring output signal based on the level of the first sensing voltage being higher than or equal to the level of the second sensing voltage; and
   a level of the first signal is higher than a level of the second signal.

4. The semiconductor device of claim 3, wherein the first signal indicates that a level of the target voltage is included in a reference voltage range, and the second signal indicates that the level of the target voltage is not included in the reference voltage range.

5. The semiconductor device of claim 1, wherein the first transistor and the second transistor have magnitudes different from each other.

6. The semiconductor device of claim 1, wherein the level of the first sensing voltage and the level of the second sensing voltage are determined based on whether the first transistor and the second transistor operate in a saturation region or in a linear region.

7. The semiconductor device of claim 6, wherein:
   the voltage sensing circuit is configured to output the first sensing voltage having a level less than the second sensing voltage based on the first transistor and the second transistor operating in the saturation region; and
   the voltage sensing circuit is configured to output the first sensing voltage having a level higher than or equal to the second sensing voltage based on the first transistor and the second transistor operating in the linear region.

8. The semiconductor device of claim 7, wherein:
based on the level of the target voltage being included in a reference voltage range, the first transistor and the second transistor are configured to operate in the saturation region; and
based on the level of the target voltage not being included in the reference voltage range, the first transistor and the second transistor are configured to operate in the linear region.

9. The semiconductor device of claim 7, wherein:
the comparing circuit is configured to output a first signal as the monitoring output signal, based on the level of the first sensing voltage being less than the level of the second sensing voltage; and
the comparing circuit is configured to output a second signal as the monitoring output signal, based on the level of the first sensing voltage being higher than or equal to the level of the second sensing voltage.

10. The semiconductor device of claim 9, wherein the first signal indicates that the level of the target voltage is included in the reference voltage range, and the second signal indicates that the level of the target voltage is not included in the reference voltage range.

11. A semiconductor device comprising:
a first voltage monitoring circuit to which a first target voltage is applied, and configured to generate a first monitoring output signal indicative of whether a level of the first target voltage is included in a first reference voltage range, using a first transistor and a second transistor arranged in a current mirror structure; and
a second voltage monitoring circuit to which the first target voltage and a second target voltage are applied, and configured to generate a second monitoring output signal indicative of whether a level of the second target voltage is included in a second reference voltage range based on the level of the first target voltage and the level of the second target voltage,
wherein a same reference bias voltage is applied to a gate of the first transistor and a gate of the second transistor from a reference voltage generating circuit, and a magnitude of the first transistor is different from a magnitude of the second transistor.

12. The semiconductor device of claim 11, wherein the second voltage monitoring circuit comprises:
an input circuit to which the first target voltage and the second target voltage are applied; and
a comparing circuit configured to generate the second monitoring output signal based on the level of the first target voltage and the level of the second target voltage,
wherein the second monitoring output signal is one of a third signal and a fourth signal having a level different from a level of the third signal.

13. The semiconductor device of claim 12, wherein:
the level of the fourth signal is higher than the level of the third signal; and
the third signal indicates that the level of the second target voltage is included in the second reference voltage range, and the fourth signal indicates that the level of the second target voltage is not included in the second reference voltage range.

14. The semiconductor device of claim 12, wherein:
the input circuit comprises a Bandgap Reference (BGR) circuit to which the first target voltage is input, and configured to output a first converted voltage based on the level of the first target voltage being included in a first conversion range; and
the comparing circuit is configured to generate the second monitoring output signal based on a level of the first converted voltage and the level of the second target voltage.

15. The semiconductor device of claim 14, wherein:
the input circuit further comprises a Digital to Analog Converter (DAC) circuit to which the first converted voltage is input, and configured to output a second converted voltage obtained by converting the level of the first converted voltage in accordance with a predetermined ratio; and
the comparing circuit is configured to generate the second monitoring output signal based on a level of the second converted voltage and the level of the second target voltage.

16. The semiconductor device of claim 11, wherein:
the first voltage monitoring circuit comprises:
a first resistive element connected to a drain of the first transistor,
a second resistive element connected to one end of the first resistive element, and
a third resistive element connected to a drain of the second transistor;
the first target voltage is applied to a source of the first transistor and a source of the second transistor; and
the first monitoring output signal is generated based on a level of a first sensing voltage provided to both ends of the second resistive element and a level of a second sensing voltage provided to both ends of the third resistive element.

17. A semiconductor system comprising:
a first voltage monitoring circuit to which a first target voltage is applied, and configured to generate a first monitoring output signal indicative of whether a level of the first target voltage is included in a first reference voltage range, using a first transistor and a second transistor arranged in a current mirror structure, wherein a same reference bias voltage is applied to a gate of the first transistor and a gate of the second transistor from a reference voltage generating circuit;
a second voltage monitoring circuit to which the first target voltage and a second target voltage applied to a target circuit are applied, and configured to generate a second monitoring output signal indicative of whether a level of the second target voltage is included in a second reference voltage range based on the level of the first target voltage and the level of the second target voltage; and
a controller configured to receive the first monitoring output signal and the second monitoring output signal, and to determine whether the level of the second target voltage is included in a third reference voltage range, based on a level of the first monitoring output signal and a level of the second monitoring output signal.

18. The semiconductor system of claim 17, wherein:
based on the level of the first target voltage being included in the first reference voltage range, the first voltage monitoring circuit is configured to output a first signal as the first monitoring output signal, and based on the level of the first target voltage not being included in the first reference voltage range, the first voltage monitoring circuit is configured to output a second signal, having a level lower than a level of the first signal, as the first monitoring output signal; and based on the level of the second target voltage being included in the second reference voltage range, the second voltage monitoring circuit is configured to output a third signal as the second monitoring output signal, and based on the level of the second target voltage not being included in the second reference voltage range, the second voltage monitoring circuit is configured to output a fourth signal, having a level higher than a level of the third signal, as the second monitoring output signal.

19. The semiconductor system of claim 18, wherein, based on the first signal being received from the first voltage monitoring circuit and the third signal being received from the second voltage monitoring circuit, the controller is configured to determine that the level of the second target voltage is included in the third reference voltage range.

20. The semiconductor system of claim 18, wherein, based on the second signal being received from the first voltage monitoring circuit, the controller is configured to determine that the second target voltage is not included in the third reference voltage range, regardless of the second monitoring output signal.

21. The semiconductor device of claim 1,
wherein the target voltage is input to the reference voltage generating circuit.

22. The semiconductor device of claim 11,
wherein the first target voltage is input to the reference voltage generating circuit.

23. The semiconductor device of claim 17,
wherein the first target voltage is input to the reference voltage generating circuit.

* * * * *